US012763757B2

(12) United States Patent
Bevara et al.

(10) Patent No.: US 12,763,757 B2
(45) Date of Patent: Oct. 13, 2026

(54) SYSTEM TO DETECT AND MONITOR SUPPLY VOLTAGE GLITCH

(71) Applicant: SAMSUNG ELECTRONICS CO., LTD., Suwon-si (KR)

(72) Inventors: Vasu Bevara, Bengaluru (IN); Aswani Aditya Kumar Tadinada, Bengaluru (IN); Parthavy Rayabarapu, Bengaluru (IN); Venkatasuryam Setty Issa, Bengaluru (IN); Sumit Kumar Pandey, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 18/770,196

(22) Filed: Jul. 11, 2024

(65) Prior Publication Data

US 2025/0364973 A1 Nov. 27, 2025

(30) Foreign Application Priority Data

May 22, 2024 (IN) ............................ 202441040027

(51) Int. Cl.

*H03K 5/24* (2006.01)
*H03K 3/011* (2006.01)
*H03K 3/0231* (2006.01)

(52) U.S. Cl.

CPC ........... *H03K 3/011* (2013.01); *H03K 3/0231* (2013.01); *H03K 5/2481* (2013.01); *H03K 5/249* (2013.01)

(58) Field of Classification Search

CPC ...... H03K 5/24; H03K 5/2472; H03K 5/2481; H03K 5/1252; H03K 3/013; H03K 3/0231; G06F 1/3206; G06F 21/75; G06F 21/755

See application file for complete search history.

(56) References Cited

U.S. PATENT DOCUMENTS

| | | | | |
|---|---|---|---|---|
| 4,710,724 A | 12/1987 | Connell et al. | | |
| 5,541,538 A | 7/1996 | Bacrania et al. | | |
| 10,156,595 B2 | 12/2018 | Nirwan et al. | | |
| 11,763,037 B2 * | 9/2023 | Xue | ...................... | G06F 21/755 713/340 |
| 11,824,436 B2 * | 11/2023 | Pu | .......................... | H02H 9/005 |

* cited by examiner

*Primary Examiner* — Hai L Nguyen

(74) *Attorney, Agent, or Firm* — Fish & Richardson P.C.

(57) ABSTRACT

A system to detect and monitor a supply voltage glitch includes a bias current generation unit configured to supply a constant bias current to a comparator even during a glitch in a supply voltage by using one or more cascaded Switched-Capacitor filters. The system includes an input reference and replica generation unit configured to generate one or more average input voltages and an instantaneous replica voltage applied to the corresponding a comparison unit by using one or more SC filters and to generate Direct Current biasing for the instantaneous replica voltage. Additionally, the system includes the comparison unit that is configured to generate an output voltage upon receiving the one or more input voltages from the input reference and replica generation unit.

16 Claims, 7 Drawing Sheets

SYSTEM TO DETECT AND MONITOR SUPPLY VOLTAGE GLITCH

CROSS-REFERENCE TO RELATED APPLICATIONS

This application claims priority to India patent application No. 202441040027, filed in the India Intellectual Property Office on May 22, 2024, the disclosure of which is incorporated by reference herein in its entirety.

BACKGROUND

In the field of analog electronics, a stable bias current for comparators is crucial for reliable and accurate functionality. Challenges arise when there is a glitch in an analog power supply (AVDD), potentially leading to bias current fluctuations or complete loss. This necessitates an integration of effective filters. In the pursuit for glitch detection, the comparators require a higher power. For instance, a comparator needs high power for few nanoseconds wide glitch detection with a large input common mode range, which in turn increases the power and area of glitch immune Low Drop-Out (LDO (346)), generating local supply for the comparator.

FIG. 1A illustrates an example architecture of a comparator 100*a* in related art. As depicted, comparator 100 comprises a bias stage 102, an input (I/P) sensing stage 104, an input (I/P) load stage 106, and a gain stage (second gain stage) 108. In the comparator 100, the input sensing stage 104 is responsible for detecting voltage differences and converting it to differential current. The I/P load stage 106 converts differential current from I/P sense stage to differential voltage. Further, the gain stage 108 amplifies a voltage difference between input load stage outputs to enhance sensitivity and provides single-ended output, while the bias stage 102 may ensure a stable and controlled bias current. However, the bias current is not independent of the glitch on the analog power supply and hence the comparator 100*a* may not function properly.

FIG. 1B illustrates an example cross-coupled comparator architecture 100*b* in related art. As depicted, the cross-coupled comparator 100*b* comprises transistors connected in a cross-coupled manner (MN7 and MN8). The cross-coupled transistors make use of positive feedback to ensure faster switching of output when input difference (INP-INN) changes polarity. The cross-coupled comparator comprises the bias stage 102, the input sensing stage 104, and the input load stage 106, and the gain stage 108. The gain stage converts differential signal to single-ended. However, as shown in FIG. 6 600, the T-dead zone 608 for existing cross-coupled comparator 100*b* 604 is larger because of the shift (V-shift) in settled or steady state values.

FIG. 2 illustrates a schematic circuit diagram of an example system 200 for detecting and monitoring a supply voltage glitch in related art. As depicted, the system 200 includes a bias current generation unit 202, an input reference and replica generation unit 204, and a comparison unit 206. The bias current generation unit 202 may include a first transistor M1 214*a*, a second transistor M2 214*b*, a third transistor M3 214*c*, and a fourth transistor M4 214*d*. However, the existing system 200 has a limitation in overlooking the impact of supply glitches on the comparator bias. The comparator is a vital component in glitch detection and relies on a stable bias for accurate and reliable operation. The absence of consideration for supply glitches in the biasing may compromise the performance of the comparator.

Further, a bandgap reference (BGR) circuit 228 may fail to operate in the presence of a supply glitch, potentially resulting in the absence of current flow into transistor M1 (214*a*). In an example, with a glitch on the supply such that the value of supply goes below the threshold voltage of transistors, the BGR circuit 228 may not work therefore a gate voltage of the first transistor M1 214*a* may be zero. If there is no filter connected between the first transistor M1 214*a* and the second transistor M2 214*b*, then the current in the second transistor M2 214*b* may be zero as well. As a result, the comparators 210, 212 may not include a bias current, and the comparators 210, 212 may not work. To avoid the scenario, where a gate voltage of the second transistor M2 214*b* goes to zero, a filter to be placed between the first transistor M1 214*a* and the second transistor M2 214*b*. The filter may include, but not be limited to, a resistor-capacitor (RC) filter, a switch-capacitor (SC) filter, and the like. A 3 to 8 decoder 230, 232 may include three inputs and eight outputs. Based on the inputs one of the eight outputs may be selected. The input reference and replica generation unit 204 may include a first resistor-capacitor filter ($R_1$, $C_4$, $C_5$), a second resistor-capacitor filter ($R_2$, $C_2$), and a third resistor-capacitor filter ($R_3$, $C_3$). The RC filter $R_1$, $C_4$, $C_5$ or $R_2$, $C_2$ or $R_3$, $C_3$ may require a huge area compared to a cascade of the SC filter. Accordingly, there is a need for a system to mitigate the impact of supply glitches on the comparator bias. By addressing this critical aspect, the improved system aims to provide a more comprehensive and effective solution for safeguarding circuits against voltage glitch attacks.

SUMMARY

In general, in some aspects, the present disclosure is directed toward a system for detecting a supply voltage glitch and provide improved isolation to a comparator due to the supply voltage glitch.

According to some aspects, the present disclosure is directed to a system to detect and monitor a supply voltage glitch. The system comprises a bias current generation unit that is configured to supply a constant bias current to the comparator during a glitch in a supply voltage by using one or more cascaded Switched-Capacitor (SC) filters. Further, the system, comprises an input reference and replica generation unit, is configured to generate one or more average input voltages and instantaneous replica voltage applied to the corresponding a comparison unit by using one or more SC filters and to generate Direct Current (DC) biasing for the instantaneous replica voltage. Furthermore, the comparison unit is configured to generate an output voltage upon receiving the one or more input voltages from the input reference and replica generation block.

BRIEF DESCRIPTION OF THE DRAWINGS

Example implementations will be more clearly understood from the following detailed description, taken in conjunction with the accompanying drawings.

DETAILED DESCRIPTION

Hereinafter, example implementations will be described in detail with reference to the accompanying drawings.

In the present disclosure, implementations may be described and illustrated in terms of blocks that carry out a described function or functions. These blocks, which may be referred to herein as units or circuits or modules or the like, may be physically implemented by analog or digital circuits such as logic gates, integrated circuits, microprocessors, microcontrollers, memory circuits, passive electronic components, active electronic components, optical components, hardwired circuits, or the like, and may optionally be driven by firmware and software. The circuits may, for example, be implemented in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the implementations may be physically separated into two or more interacting and discrete blocks without departing from the scope of the present disclosure. Likewise, the blocks of the implementations may be physically combined into more complex blocks without departing from the scope of the present disclosure.

Figure 1A:
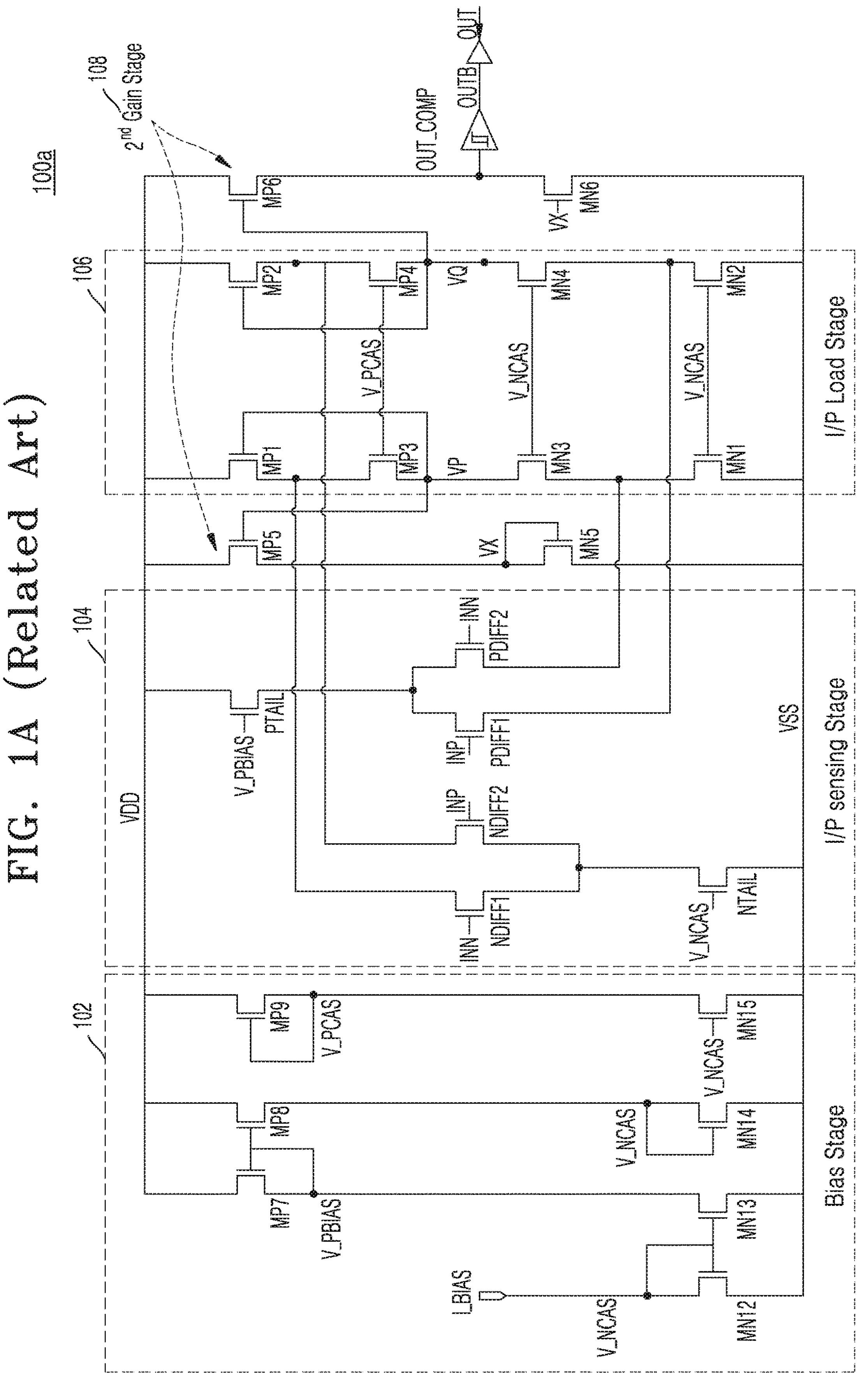
FIG. 1A (Related Art)
FIG. 1A illustrates an example of an architecture of a comparator in related art.
Figure 1B:
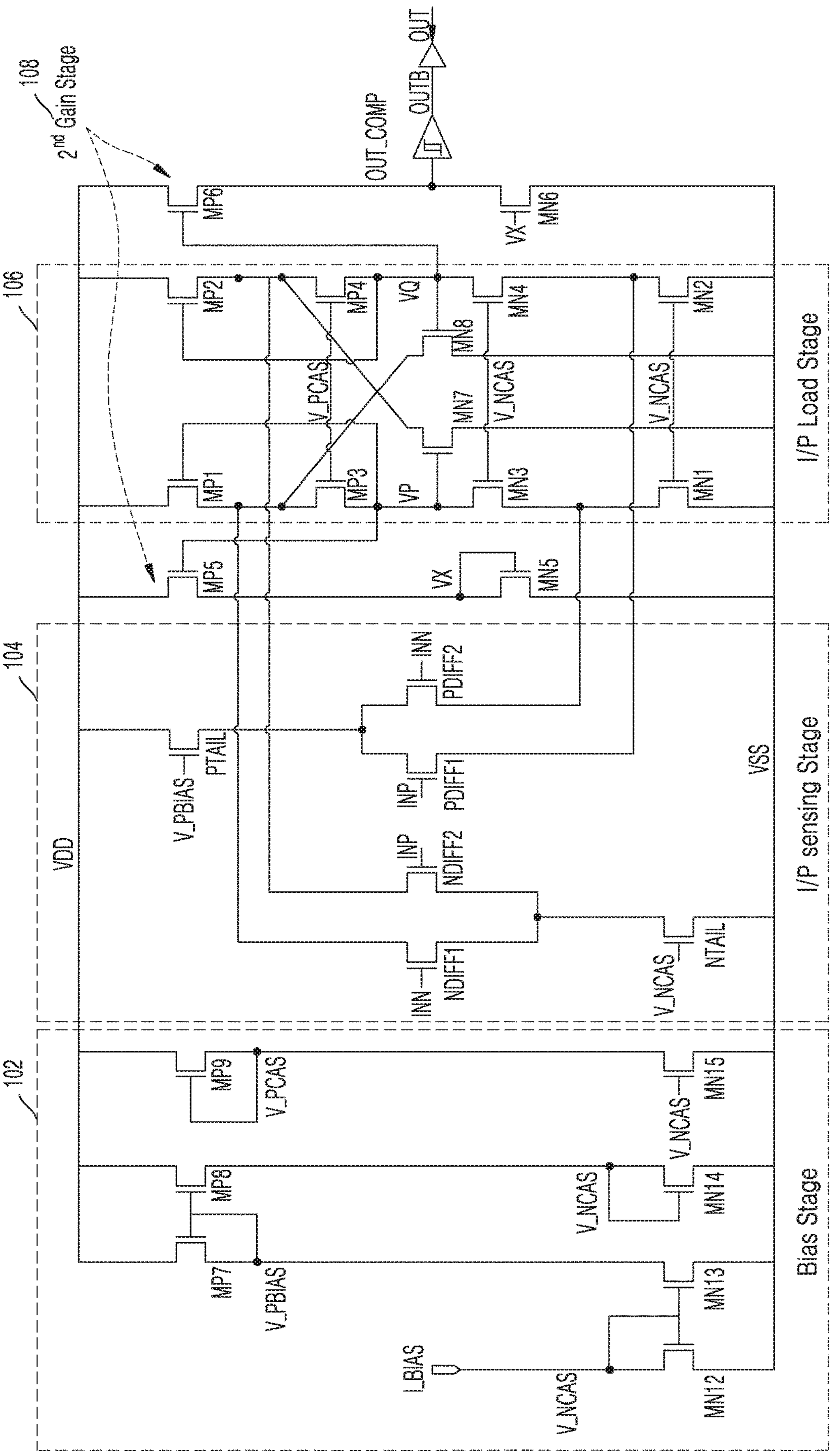
FIG. 1B (Related Art)
FIG. 1B illustrates an example of a use case of a cross-coupled comparator architecture in related art.
Figure 2:
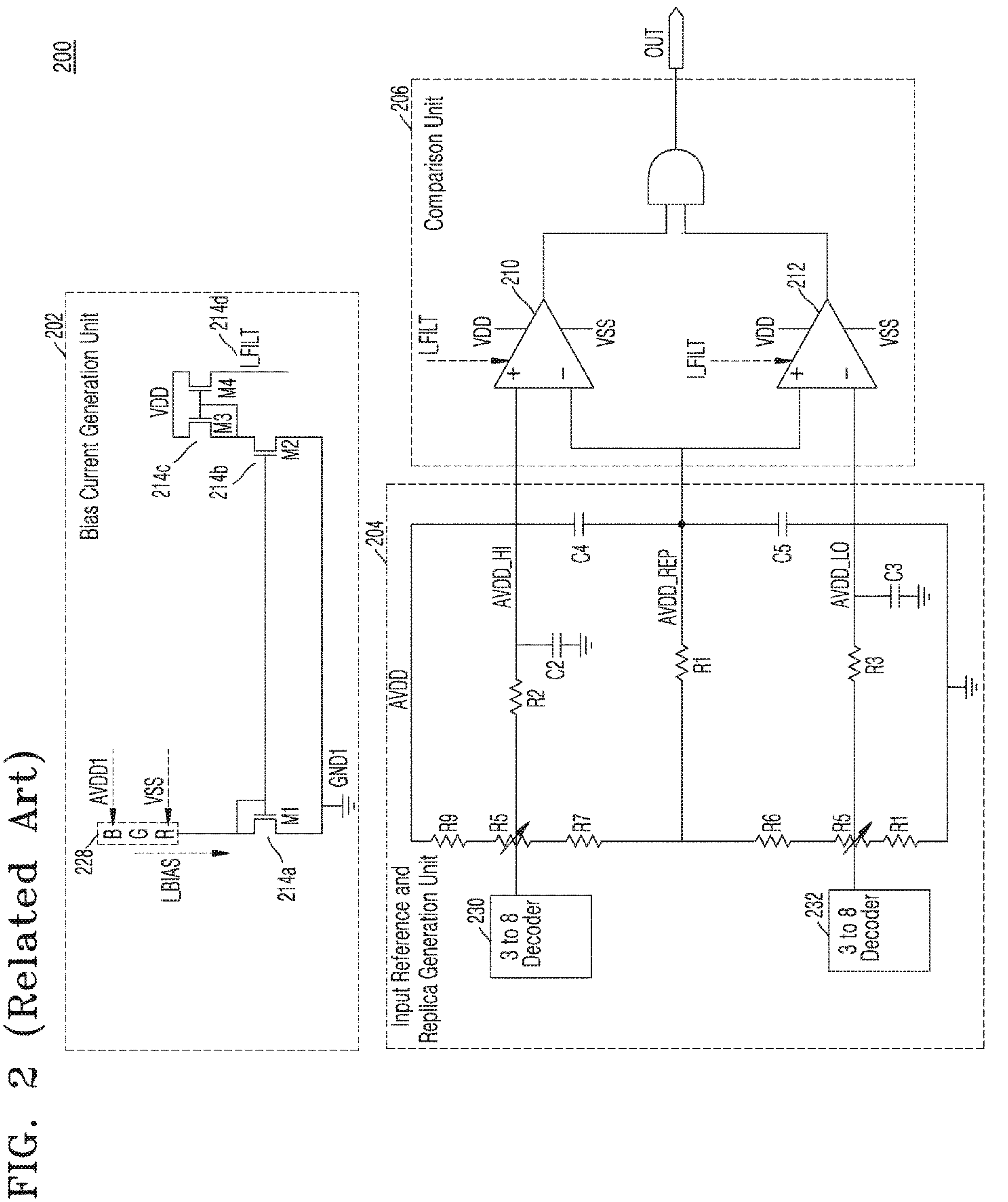
FIG. 2 (Related Art)
FIG. 2 illustrates a schematic circuit diagram of a system for detecting and monitoring a supply voltage glitch in related art.
Figure 3:
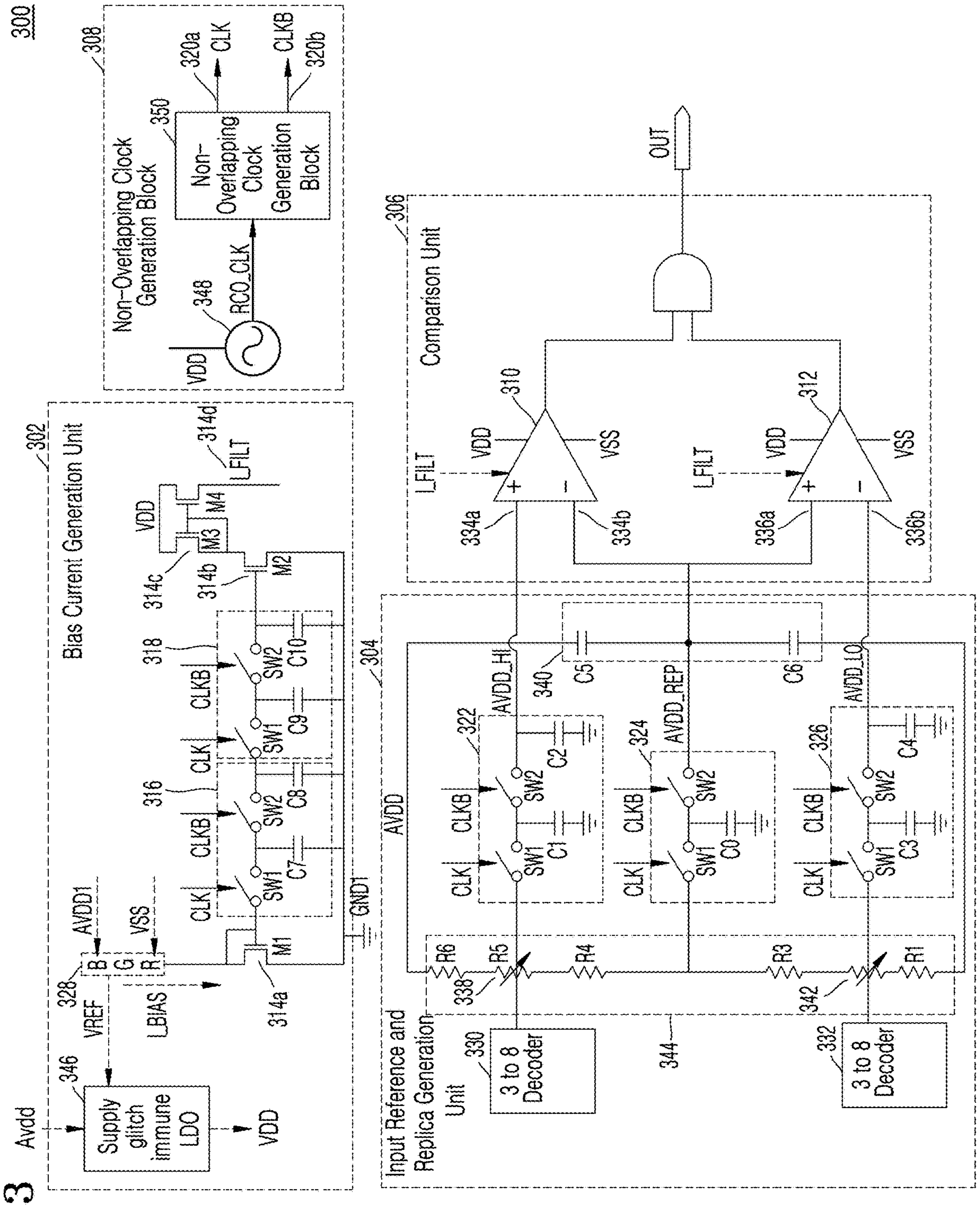
FIG. 3 illustrates a schematic circuit diagram of an example of a system for detecting and monitoring a supply voltage glitch according to some implementations.

FIG. 3 illustrates a schematic circuit diagram of a system 300 for detecting and monitoring a supply voltage glitch according to some implementations. In FIG. 3, the circuit diagram 300 includes a bias current generation unit (or circuit) 302, an input reference and replica generation unit (or circuit) 304, a comparison unit (or circuit) 306, and a non-overlapping clock generation block 308. The bias current generation unit 302 may include a first transistor M1 314*a*, a second transistor M2 314*b*, a third transistor M3 314*c*, and a fourth transistor M4 314*d*. The bias current generation unit 302 may be configured to supply a constant bias current to the comparators 310, 312 during a glitch in a supply voltage by using one or more cascaded Switched-Capacitor (SC) filters 316, 318 (hereinafter referred to as one or more cascaded SC filters 316, 318). The one or more cascaded SC filters 316, 318 may be mounted between the first transistor ($M_1$) 314*a* of the bias current generation unit 302 and a second transistor ($M_2$) 314*b* of the bias current generation unit 302.

In some implementations, the input reference and replica generation unit 304 may be configured to generate one or more average input voltages and instantaneous replica voltage applied to the corresponding comparison unit 306 by using the one or more SC filters 322, 324, 326 and to generate Direct Current (DC) biasing for the instantaneous replica voltage. The one or more average input voltages may include, but are not limited to, corresponding to a positive supply glitch, a high reference voltage (AVDD_HI), and corresponding to a negative supply glitch, a low reference voltage (AVDD_LO), and an instantaneous replica voltage (AVDD_REP) to compare with the reference voltages (AVDD_HI, AVDD_LO). The high reference voltage (AVDD_HI) may be utilized to detect the positive supply glitch and the low reference voltage (AVDD_LO) may be utilized to detect the negative supply glitch. In an embodiment of the present disclosure, the high reference voltage (AVDD_HI), the low reference voltage (AVDD_LO) may be derived from same supply voltage (AVDD), hence any change in the supply voltage (AVDD) may be reflected on to the inputs INN, and INP of the comparators 310, 312, respectively thereby helping in monitoring the glitch on the supply voltage (AVDD).

A first SC filter 322 of the one or more SC filters 322, 324, 326 and a first tunable resistive divider 338 in R-ladder 344 on AVDD may be configured to provide the high reference voltage (AVDD_HI) to a non-inverting input 334*a* of a first comparator 310. A capacitive divider 340 on AVDD and second SC filter 324 of the one or more SC filters 322, 324, 326 may be configured to provide the instantaneous replica voltage to an inverting input 334*b* of the first comparator 310 and to provide the instantaneous replica voltage to a non-inverting input 336*a* of a second comparator 312. Furthermore, a third SC filter 326 of the one or more SC filters 322, 324, 326, and a second tunable resistive divider (342) in R-ladder 344 on AVDD may be configured to provide the low reference voltage (AVDD_LO) to an inverting input 336*b* of the second comparator 312.

In some implementations, the first SC filter 322 of the one or more SC filters 322, 324, 326 mounted at the non-inverting input 334*a* of the first comparator 310 and the third SC filter 326 of the one or more SC filters 322, 324, 326 mounted at the inverting input 336*b* of the second comparator 312 may be configured to provide improved isolation and prevent a propagation of supply glitches through the R-ladder (344). Further, the second SC filter 324 of the one or more SC filters 322, 324, 326 mounted at the inverting input 334*b* of the first comparator 310 and the non-inverting input 336*b* of the second comparator 312 may be configured to block a supply glitch feed through from the instantaneous replica voltage (AVDD_REP) to the high reference voltage (AVDD_HI) and the low reference voltage (AVDD_LO) and to provide DC biasing at the instantaneous replica voltage (AVDD_REP). The decoders 330, 332 may be coupled to the comparators 310, 312. The decoders 330, 332 may be used for tuning the high reference voltage (AVDD_HI) and the low reference voltage (AVDD_LO) levels through the tunable resistors 338, 342.

In some implementations, the one or more SC filters 316, 318, 322, 324, 326 may include SW1-C1-SW2-C2 configuration with a first switch SW1 and a second switch SW2 turning ON alternatively and C2>>C1. When the first switch SW1 is turned on, the first capacitor C1 may be charged to an input voltage Vin. Further, when the first switch SW1 is turned off and the second switch SW2 is turned on, the charge on the capacitor C1 may be redistributed between the first capacitor C1 and the second capacitor C2. Assuming the second capacitor C2 may be charged to Vout_prev in a previous cycle, the new output voltage may become (C1*Vin+C2*Vout_prev)/(C1+C2). The output voltage may not instantaneously become equal to the input voltage Vin but requires several such cycles. The cut-off frequency of the one or more SC filters 316, 318, 322, 324, 326 may depend on a ratio of the first capacitor C1 and the second capacitor C2, and also the frequency of the non-overlapping clocks operating SW1 and SW2. If the first switch SW1 and the second switch SW2 may be turned on simultaneously, then the input voltage Vin and the output voltage Vout may be shorted, then the filtering action may be lost.

The one or more SC filters 316, 318, 322, 324, 326 may be controlled using one or more non-overlapping clocks (CLK and CLKB) 320*a*, 320*b*. The non-overlapping clock generation block 308 may provide the one or more non-overlapping clocks (CLK and CLKB) 320*a*, 320*b*. The one or more SC filters 316, 318, 322, 324, 326 may include a first switch SW1, and a second switch SW2. The first switch SW1 and the second switch SW2 may not be activated at the same time by using the one or more non-overlapping clocks (CLK and CLKB) 320*a*, 320*b*. A Ring Oscillator (RCO) 348 may generate the RCO_CLK which may be fed to a Non-Overlapping Clock generator 350 to generate one or more non-overlapping clocks (CLK and CLKB) and the one or more non-overlapping clocks (CLK and CLKB) have different phases, ensuring that the one or more cascaded SC filters 316, 318 operate in a precise and coordinated manner. In an example, the SC filter 316, 318, 322, 324, 326 unlike the RC low pass filter, has notches in its transfer function, where the SC filter completely blocks disturbance for certain duration in the input voltage Vin. If there is a disturbance in the input voltage Vin at the time when the first switch SW1 is OFF and the second switch SW2 is ON, such disturbance may not be transferred to the second capacitor C2. The SC filters 316, 318, 322, 324, 326 completely block the signal for certain durations.

The non-overlapping clocks (CLK and CLKB) 320*a*, 320*b* may be generated internally in the circuit. The circuitry to generate non-overlapping clocks 320*a*, 320*b*, the comparators 310, 312, and last stage of current mirroring of transistors 314*c*, 314*d* (M3-M4) works on VDD supply, which is less sensitive to glitches in AVDD supply and may be internally generated by a low dropout LDO 346 from the same AVDD supply, but with a mechanism that makes the LDO 346 o/p (VDD) less sensitive to AVDD glitches. The supply glitch immune LDO 346 may take glitch susceptible supply AVDD, and VREF from the BGR circuit 328 as input and generate glitch immune supply, VDD as output. This VDD output may be used as supply for the comparators 310, 312 and p-channel transistor current mirror in the bias generation unit 302 of the transistors 314*c*, 314*d* (M3-M4), and the non-overlapping clock generation block 308.

The SC filters 316, 318, 322, 324, 326 may require less area as compared to RC filters with similar cut-off frequencies and provide good isolation to AVDD_HI and AVDD_LO from supply glitch propagating through the R ladder 344. The SC filter 324 on AVDD_REP may reduce supply glitch feed through from AVDD_REP to high reference voltage AVDD_HI and low reference voltage AVDD_LO.

The one or more SC filters 316, 318, 322, 324, 326 may include one or more switched capacitors C0, C1, C2, C3, C4, C5, C6, C7, C8, C9, and C10, and non-overlapping clocks CLK and CLKB. An input voltage Vin is supplied to the one or more SC filters 316, 318, 322, 324, and 326. Further, the input voltage Vin may be sampled at the falling edge of the non-overlapping clock CLK. The non-overlapping clock CLKB may rise and the voltage across the switched capacitors C0, C1, C2, C3, C4, C5, C6, C7, C8, C9, C10 may be transferred to an output (Vout) of one or more SC filters 316, 318, 322, 324, 326.

Figure 4:
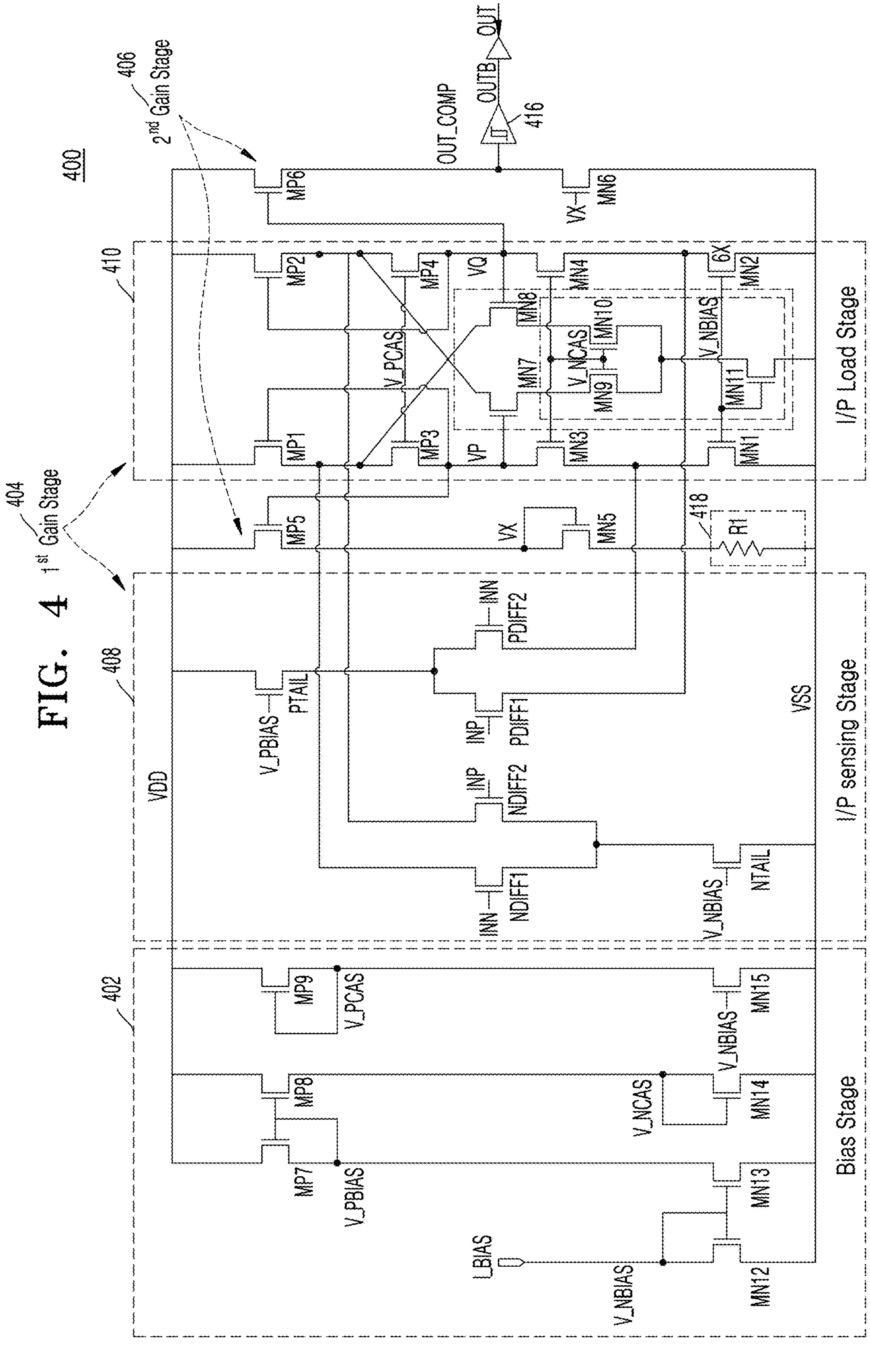
FIG. 4 illustrates a schematic circuit diagram of an example of a comparator architecture according to some implementations.

FIG. 4 illustrates a schematic diagram of a comparator architecture 400 according to some implementations. In FIG. 4, the comparator architecture 400 may include the first comparator 310 or the second comparator 312. Each comparator 310 or 312 of the comparison unit 306 may include a bias stage 402, a first gain stage 404, and a second gain stage 406. The first gain stage 404 includes an input sense stage 408, and an input (I/P) load stage 410. The bias stage 402 of each comparator 310/312 may be configured to generate one or more bias voltages (V_PCAS, V_PBIAS, V_NCAS, V_NBIAS) for the comparators 310/312.

The input load stage 410 and the second gain stage 406 may include P-channel transistors MP1, MP2, MP3, MP4, MP5, and MP6, and N-channel transistors MN1, MN2, MN3, MN4, MN5, MN6, MN7, MN8, MN 9, MN10, and MN 11. The P-channel transistors MP1, MP2, MP3, MP4, and N-channel transistors MN1, MN2, MN3, and MN4 constitute a standard folded cascode load stage. Wherein, the P-channel transistors MP3, MP4, and the N-channel transistors MN3, MN4 are cascode transistors for base transistors MP1, MP2, and MN1, MN2 respectively. The P-channel transistors MP1 and MP5, MP2 and MP6, and N-channel MN5 and MN6 constitute current mirror pairs. The currents in I/P load stage may be mirrored to a $2^{nd}$ gain stage using the above-mentioned current mirror pairs. The P-channel transistor MP6 and the N-channel transistor MN6 combine the currents in the $2^{nd}$ gain stage to generate a single-ended output voltage. The N-channel transistors MN7 and MN8 may be cross-coupled transistors for positive feedback, which increases gain in a $1^{st}$ gain stage. The N-channel transistors MN9, MN10, MN11 may be used as source-degeneration to reduce the transconductance (gm) of the cross-coupled transistors. The N-channel transistor MN11 defines and controls the current in the N-channel transistors MN7 and MN8, thereby controlling the transconductance (gm) of the N-channel transistors MN7 and MN8, and hence, controlling gain provided by the cross-coupled transistors, and swing at VP and VQ. Structure formed by the N-channel transistors MN7, MN8, MN9, MN10, and MN11 may be seen as a differential amplifier, where the N-channel transistors MN7 and MN8 are differential pair, which are source degenerated by the N-channel transistors MN9 and MN10, and N-channel transistor MN11 is the tail current source. The current defined by the N-channel transistor MN11 may be steered between the N-channel transistor MN7 and the N-channel transistor MN8 based on a gate voltage of N-channel transistors MN7 and MN8. Further, the input sense stage 408 may include P-channel transistors PDIFF1, PDIFF2, PTAIL and N-channel transistors NDIFF1, NDIFF2, NTAIL. Furthermore, the bias stage 402 may include the P-type channel transistors MP7, MP8, MP9, and the N-type channel transistors MN12, MN13, MN14, MN15.

In some implementations, the input sense stage 408 of each comparator 310 or 312 may be configured to receive two comparator inputs INN, and INP and generate differential current output gm2*INP−gm1*INN for the I/P load stage 410. The input sense stage 408 may be a rail-to-rail input stage employing P-type metal-oxide-semiconductor field-effect transistor (PMOS) and N-type metal-oxide-semiconductor field-effect transistor (NMOS) differential pairs. The I/P load stage 410 of each comparator 310, 312 may be configured to receive the generated differential current output gm2*INP−gm1*INN and generate differential voltage VP-VQ.

In some implementations, the I/P load stage 410 may be configured to use a transistor based source degeneration resistor 412 added to a current controlled cross-coupled section 414 of the I/P load stage 410 to reduce steady-state swing at a first gain stage 404 output, that allows quicker detection of changes in input difference polarity associated with each comparator 310, 312. Further, the second gain stage 406 of each comparator 310, 312 may be configured to convert the generated differential voltage VP-VQ to single-ended output OUT_COMP and the single-ended output OUT_COMP may be processed by a Schmitt trigger 416 to generate the output voltage. The second gain stage 406 may be configured to use a resistor R1 418 to create asymmetry in the second gain stage 406 for detecting an input difference during a high-to-low transition in the output voltage. In an example, 1→0 transition of single-ended output OUT-_COMP is important, hence a small resistor R1 is kept at the source of MN5 in a left branch of the second gain stage 406. The voltage at the gate of metal Oxide-Semiconductor MN5 may be given by VX=IDS_MN5*R1+VGS_MN5, it means that the N-channel transistor MN6 receives larger VGS as compared to the N-channel transistor MN5 and may discharge single-ended output OUT_COMP node faster. The drawback of keeping the small resistor R1, is that 0→1 transition may become slow. However, the system focuses on 1→0 transition only. Normally, to increase the speed of the circuit, current needs to be increased but this will make both 0→1 & 1→0 transitions faster. Here, the system achieves the required speed for the desired 1→0 transition, at a lower current.

Figure 5:
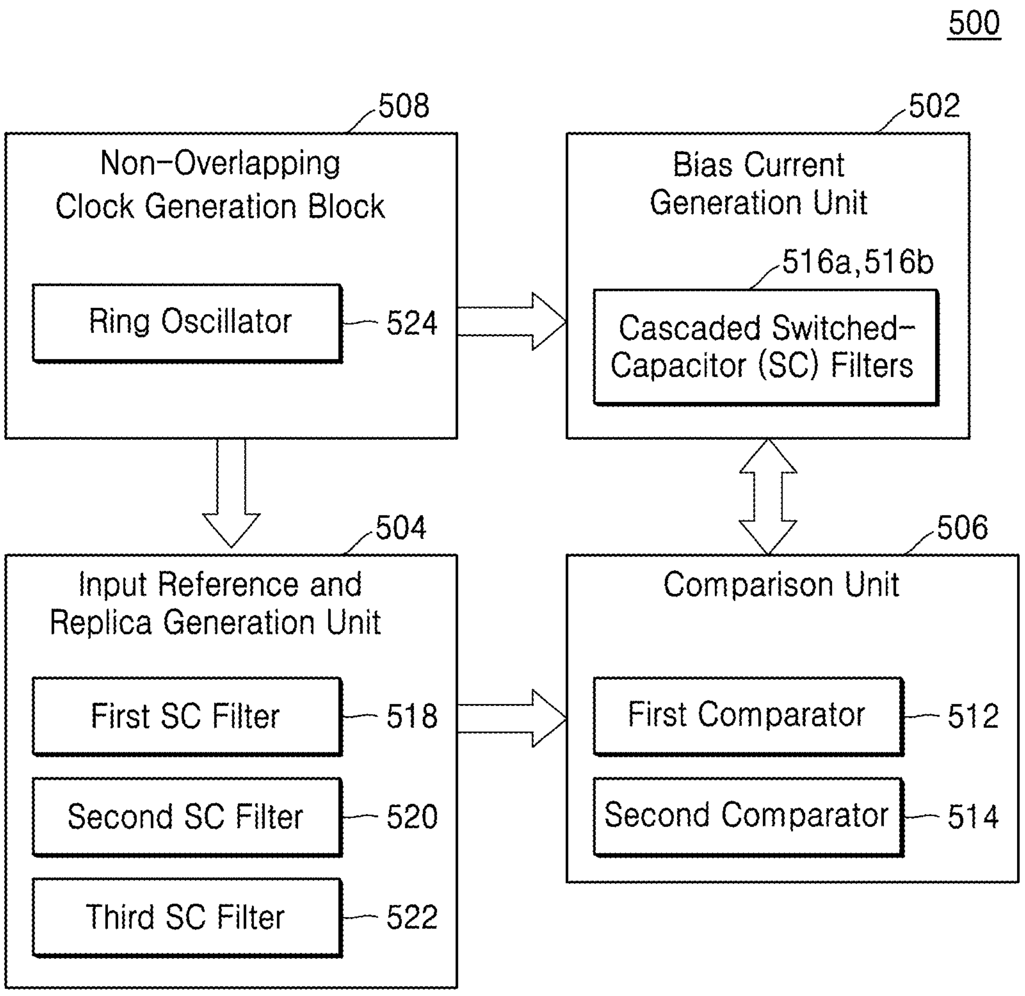
FIG. 5 illustrates a schematic block diagram of an example of a system for detecting and monitoring a supply voltage glitch according to some implementations.

FIG. 5 illustrates a schematic block diagram of a system 500 for detecting and monitoring a supply voltage glitch according to some implementations. In some implementations, the system 500 includes a bias current generation unit 502, an input reference and replica generation unit 504, a comparison unit 506, and a non-overlapping clock generation block 508. The bias current generation unit 302, the input reference and replica generation unit 304, a comparison unit 306, and the non-overlapping clock generation block 308 may be represented as the bias current generation unit 502, the input reference and replica generation unit 504, the comparison unit 506, and the non-overlapping clock generation block 508. The comparison unit 506 includes a first comparator 512, and a second comparator 514. The bias current generation unit 502 may include cascaded Switched-Capacitor (SC) filters 516*a*, 516*b*. Further, the input reference and replica generation unit 504 may include a first Switched-Capacitor (SC) filter 518, a second Switched-Capacitor (SC) filter 520, and a third Switched-Capacitor (SC) filter 522.

The bias current generation unit 502 may be configured to supply a constant bias current to the first comparator 512 or the second comparator 514 even during a glitch in a supply voltage by using one or more cascaded Switched-Capacitor (SC) filters 516*a*, 516*b*. In some implementations, the bias current generation unit 502 always provides constant current irrespective of the glitch in the supply voltage. The non-overlapping clock generation block 508 may include a ring oscillator 524. In some implementations, the ring oscillator 524 and the non-overlapping clock generator block 350 may be configured to generate one or more non-overlapping clocks (CLK and CLKB). The one or more non-overlapping clocks (CLK and CLKB) may include different phases, ensure that the one or more cascaded SC filters 516*a*, 516*b*, 518, 520, 522 operate in a precise and coordinated manner. The one or more SC filters 516*a*, 516*b*, 518, 520, 522 may be controlled using one or more non-overlapping clocks (CLK and CLKB). The one or more SC filters 316, 318, 322, 324, 326 may be represented as the one or more SC filters 516*a*, 516*b*, 518, 520, 522.

Figure 6:
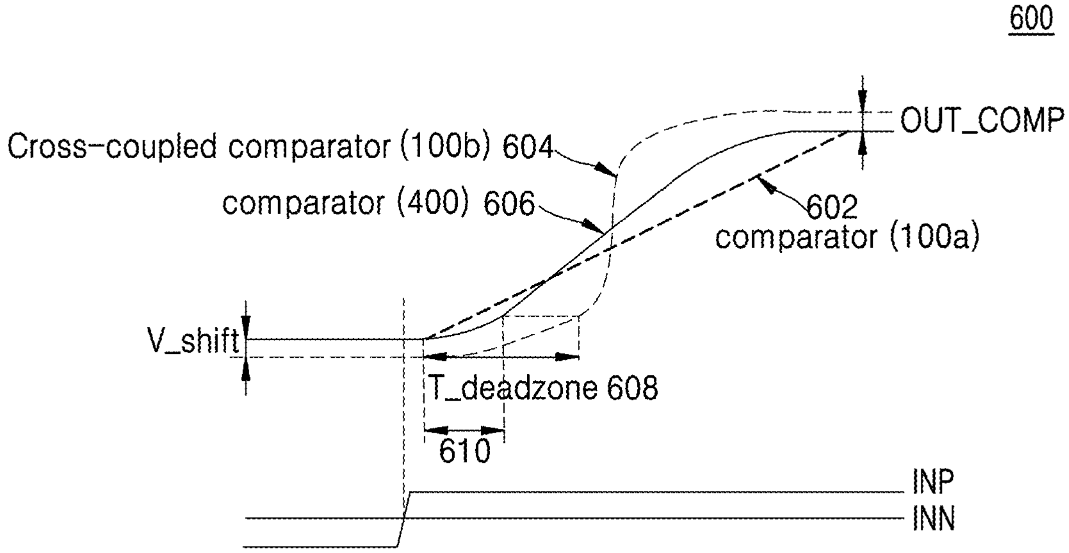
FIG. 6 illustrates examples of representational output waveforms of comparator at OUT_COMP node according to some implementations.

FIG. 6 illustrates examples of representational output waveforms 600 of comparator at OUT_COMP node according to some implementations. In FIG. 6, the output waveforms 600 of comparator include comparator input waveforms INN, and INP, a conventional comparator waveform 602, a cross-coupled comparator waveform 604, and a comparator waveform 606. The comparator waveform 606 starts to switch faster as compared to 604. T-dead zone 610 of the comparator waveform 606 may be smaller than to the T-dead zone 608 of the cross-coupled comparator waveform 604. The waveforms 602, 604 may belong to the conventional comparator 100*a*, and the cross-coupled comparator 100*b*. T-dead zone 608 for the cross-coupled comparator waveform 604 may be larger because of the shift (V-shift) in settled or steady state values. The comparator waveform 606 may include less dead zone compared to the cross-coupled comparator waveform 604 and higher slope compared to the conventional comparator waveform 602.

In some implementations, the first gain stage 404 may be configured to use the transistor based source degeneration resistor 412 added to the current controlled cross-coupled section 414 of the first gain stage 404 to reduce steady-stage swing at a first gain stage output, that allows quicker detection of changes in input difference polarity associated with each comparator 310, 312.

The present disclosure provides for various technical advancements based on the key features discussed above. The system not only excels in power efficiency but also meets offset specifications with remarkable accuracy, ensuring reliable and precise comparator performance. The present disclosure employs cascaded switched capacitor filters to ensure that bias current remains independent of the supply glitches. Particularly, the cascaded switched capacitor filters maintain stable bias current, and prevent disruptions caused by the supply glitches. Further, the cascaded switched capacitor filters contribute to a significant reduction in the overall footprint, enhancing spatial efficiency. The adoption of cascaded switched capacitors substantially enhances the isolation of the comparator inputs AVDD_HI and AVDD_LO from supply glitches. This fortification ensures the reliable and uninterrupted performance of the comparator even in challenging voltage fluctuation scenarios. The comparator is developed with an impressive capability to detect narrow supply glitches of few ns with large glitches close to ground rail or close to double the supply rail. This feature showcases the responsiveness and sensitivity of the architecture to transient changes in the power supply, enhancing the overall robustness of the system. While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A system for detecting and monitoring a supply voltage glitch, comprising:

a comparison circuit including a first comparator and a second comparator;

a bias current generation circuit configured to, based on a glitch in a supply voltage, supply a constant bias current to the comparison circuit by using one or more cascaded switched-capacitor filters; and an input reference and replica generation circuit configured to:

generate a high reference voltage, a low reference voltage, and an instantaneous replica voltage applied to the comparison circuit by using one or more switched-capacitor (SC) filters, the one or more SC filters including a second SC filter connected to an inverting input of the first comparator and a non-inverting input of the second comparator, and using the second SC filter, block a supply glitch fed through from the instantaneous replica voltage to the high reference voltage and the low reference voltage, and provide direct current biasing at the instantaneous replica voltage;

wherein the comparison circuit is configured to generate an output voltage based on the high reference voltage, the low reference voltage, and the instantaneous replica voltage from the input reference and replica generation circuit.

2. The system as claimed in claim 1, wherein each of the first comparator and the second comparator comprises a bias stage, a first gain stage, and a second gain stage;

wherein the first gain stage comprises an input sense stage and an input load stage;

wherein the bias stage is configured to generate one or more bias voltages for each of the first comparator and the second comparator;

wherein the input sense stage is configured to receive two comparator inputs and generates differential current output for the input load stage;

wherein the input load stage is configured to receive the generated differential current output and generate differential voltage;

wherein the input load stage is configured to use a transistor-based source degeneration resistor added to a current controlled cross-coupled section of the input load stage, wherein the input load stage is configured to reduce a steady-state swing at a first gain stage output and allow detection of changes in input difference polarity associated with each of the first comparator and the second comparator;

wherein the second gain stage is configured to convert the generated differential voltage to single-ended output and the single-ended output is processed by a Schmitt trigger to generate the output voltage; and wherein the second gain stage is configured to use a resistor to create asymmetry in the second gain stage configured to detect an input difference during a high-to-low transition in the output voltage.

3. The system as claimed in claim 1, wherein the one or more cascaded switched-capacitor filters are mounted between a first transistor of the bias current generation circuit and a second transistor of the bias current generation circuit.

4. The system as claimed in claim 1, wherein the one or more SC filters are configured to control use of one or more non-overlapping clocks.

5. The system as claimed in claim 4, comprising a non-overlapping clock generation block configured to generate the one or more non-overlapping clocks, wherein the one or more non-overlapping clocks have different phases.

6. The system as claimed in claim 1, wherein the high reference voltage is utilized to detect a positive supply glitch and the low reference voltage is utilized to detect a negative supply glitch.

7. The system as claimed in claim 1, wherein the one or more SC filters further includes a first SC filter and a third SC filter, wherein the first SC filter of the one or more SC filters and a first tunable resistive divider circuit are configured to generate the high reference voltage to the non-inverting input of the first comparator;

wherein the second SC filter of the one or more SC filters, a second tunable resistive divider circuit, and a capacitive divider circuit are configured to provide the instantaneous replica voltage to the inverting input of the first comparator;

wherein the second SC filter of the one or more SC filters, the second tunable resistive divider circuit, and the capacitive divider circuit are configured to provide the instantaneous replica voltage to the non-inverting input of the second comparator; and wherein the third SC filter of the one or more SC filters and the second tunable resistive divider circuit are configured to provide the low reference voltage to the inverting input of the second comparator.

8. The system as claimed in claim 1, wherein the one or more SC filters further includes a first SC filter connected to the non-inverting input of the first comparator and a third SC filter connected to the inverting input of the second comparator, and wherein the first SC filter and the third SC filter are configured to provide isolation and restrict a propagation of supply glitches through an R-ladder.

9. A method for detecting and monitoring a supply voltage glitch, the method comprising:

supplying, using a bias current generation circuit, a constant bias current to a comparison circuit, based on a glitch in a supply voltage, by using one or more cascaded switched-capacitor filters, wherein the comparison circuit includes a first comparator and a second comparator;

generating, using an input reference and replica generation circuit, a high reference voltage, a low reference voltage, and an instantaneous replica voltage applied to the comparison circuit by using one or more switched-capacitor (SC) filters, wherein the one or more SC filters include a second SC filter connected to an inverting input of the first comparator and a non-inverting input of the second comparator;

blocking, using the second SC filter of the input reference and replica generation circuit, a supply glitch fed through from the instantaneous replica voltage to the high reference voltage and the low reference voltage, and providing direct current biasing at the instantaneous replica voltage; and generating, using the comparison circuit, an output voltage based on the high reference voltage, the low reference voltage, and the instantaneous replica voltage from the input reference and replica generation circuit.

10. The method of claim 9, wherein each of the first comparator and the second comparator comprises a bias stage, a first gain stage, and a second gain stage;

wherein the first gain stage comprises an input sense stage and an input load stage;

wherein the bias stage is configured to generate one or more bias voltages for each of the first comparator and the second comparator;

wherein the input sense stage is configured to receive two comparator inputs and generates differential current output for the input load stage;

wherein the input load stage is configured to receive the generated differential current output and generate differential voltage;

wherein the input load stage is configured to use a transistor-based source degeneration resistor added to a current controlled cross-coupled section of the input load stage, wherein the input load stage is configured to reduce a steady-state swing at a first gain stage output allowing detection of changes in input difference polarity associated with each of the first comparator and the second comparator;

wherein the second gain stage is configured to convert the generated differential voltage to single-ended output and the single-ended output is processed by a Schmitt trigger to generate the output voltage; and wherein the second gain stage is configured to use a resistor to create asymmetry in the second gain stage configured to detect an input difference during a high-to-low transition in the output voltage.

11. The method of claim 9, wherein the one or more cascaded switched-capacitor filters are mounted between a first transistor of the bias current generation circuit and a second transistor of the bias current generation circuit.

12. The method of claim 9, wherein the one or more SC filters are configured to control use of one or more non-overlapping clocks.

13. The method of claim 12, comprising a non-overlapping clock generation block configured to generate the one or more non-overlapping clocks, wherein the one or more non-overlapping clocks have different phases.

14. The method of claim 9, wherein the high reference voltage is utilized to detect a positive supply glitch and the low reference voltage is utilized to detect a negative supply glitch.

15. The method of claim 9, wherein the one or more SC filters further includes a first SC filter and a third SC filter, wherein the first SC filter of the one or more SC filters and a first tunable resistive divider circuit are configured to generate the high reference voltage to the non-inverting input of the first comparator;

wherein the second SC filter of the one or more SC filters, a second tunable resistive divider circuit, and a capacitive divider circuit are configured to provide the instantaneous replica voltage to the inverting input of the first comparator;

wherein the second SC filter of the one or more SC filters, the second tunable resistive divider circuit, and the capacitive divider circuit are configured to provide the instantaneous replica voltage to the non-inverting input of the second comparator; and wherein the third SC filter of the one or more SC filters and the second tunable resistive divider circuit are configured to provide the low reference voltage to the inverting input of the second comparator.

16. The method of claim 9, wherein the one or more SC filters further includes a first SC filter connected to the non-inverting input of the first comparator and a third SC filter connected to the inverting input of the second comparator, and wherein the first SC filter and the third SC filter are configured to provide isolation and restrict a propagation of supply glitches through an R-ladder.

* * * * *